(12) United States Patent
Xiao et al.

(10) Patent No.: US 11,614,667 B2
(45) Date of Patent: Mar. 28, 2023

(54) ARRAY SUBSTRATE AND DISPLAY PANEL

(71) Applicants: Ordos Yuansheng Optoelectronics Co., Ltd., Inner Mongolia (CN); BOE TECHNOLOGY GROUP CO., LTD., Beijing (CN)

(72) Inventors: Zhenhong Xiao, Beijing (CN); Peng Liu, Beijing (CN); Chao Liang, Beijing (CN); Aiyu Ding, Beijing (CN); Yongqiang Zhang, Beijing (CN); Jingyi Xu, Beijing (CN); Hui Yuan, Beijing (CN); Jiantao Liu, Beijing (CN)

(73) Assignees: Ordos Yuansheng Optoelectronics Co., Ltd., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/485,297

(22) Filed: Sep. 24, 2021

(65) Prior Publication Data

US 2022/0187665 A1 Jun. 16, 2022

(30) Foreign Application Priority Data

Dec. 11, 2020 (CN) .......................... 202022981960.4

(51) Int. Cl.
*G02F 1/1333* (2006.01)
*G02F 1/1345* (2006.01)
*G02F 1/1362* (2006.01)
*G06F 3/041* (2006.01)
(Continued)

(52) U.S. Cl.
CPC .... *G02F 1/136286* (2013.01); *G02F 1/13338* (2013.01); *G02F 1/13452* (2013.01); *G06F 3/0412* (2013.01); *G06F 3/0416* (2013.01); *H01L 27/124* (2013.01); *B60K 35/00* (2013.01); *B60K 2370/1438* (2019.05); *B60K 2370/152* (2019.05)

(58) Field of Classification Search
CPC .......... G02F 1/136286; G02F 1/13452; G02F 1/13338; G06F 3/0412; G06F 3/0416; B60K 35/00; B60K 2370/1438; B60K 2370/152
See application file for complete search history.

(56) References Cited

U.S. PATENT DOCUMENTS

| 2011/0096258 A1* | 4/2011 | Shim | .................. H01L 27/1255 438/34 |
| 2015/0205418 A1* | 7/2015 | Nam | ..................... G06F 3/0446 345/174 |
| 2017/0184928 A1* | 6/2017 | Tsai | ....................... G02F 1/1368 |

(Continued)

*Primary Examiner* — Ryan A Lubit
(74) *Attorney, Agent, or Firm* — Houtteman Law LLC

(57) ABSTRACT

The present disclosure provides an array substrate and a display panel. The array substrate includes a base substrate and at least one signal line unit in a fan-out region of the base substrate. Each of the at least one signal line unit includes two first signal lines and one second signal line, and the two first signal lines and the one second signal line are respectively in different layers and extend in a same direction. A center line of an orthographic projection of the one second signal line on the base substrate overlaps with a center line of an orthographic projection of an interval region between the two first signal lines.

19 Claims, 5 Drawing Sheets

(51) Int. Cl.
*H01L 27/12* (2006.01)
*B60K 35/00* (2006.01)

(56) References Cited

U.S. PATENT DOCUMENTS

| | | | |
|---|---|---|---|
| 2018/0188584 A1* | 7/2018 | Yeh | G02F 1/1337 |
| 2018/0299984 A1* | 10/2018 | Zang | G06F 3/044 |
| 2019/0204942 A1* | 7/2019 | Xu | G06F 3/041 |
| 2020/0110497 A1* | 4/2020 | Jin | G06F 3/0416 |
| 2020/0301535 A1* | 9/2020 | Choi | G06F 3/0412 |
| 2021/0294458 A1* | 9/2021 | Tominaga | G06F 3/0412 |

* cited by examiner

ARRAY SUBSTRATE AND DISPLAY PANEL

CROSS-REFERENCE TO RELATED APPLICATIONS

The present application claims the priority of the Chinese Patent Application No. 202022981960.4, filed on Dec. 11, 2020, the content of which is incorporated herein by reference in its entirety.

TECHNICAL FIELD

The present disclosure relates to the field of display technology, and in particular relates to an array substrate and a display panel.

BACKGROUND

At present, with the rapid development and popularization and the increasing market demand of vehicle-mounted display products, the vehicle-mounted display products with good performance and simple appearance gradually become the focus of customers.

SUMMARY

According to one aspect of the present disclosure, an array substrate is provided. The array substrate includes a base substrate and at least one signal line unit on the base substrate, the array substrate including a fan-out region, and the at least one signal line unit being in the fan-out region, wherein each of the at least one signal line unit includes two first signal lines and one second signal line; in each of the at least one signal line unit, the two first signal lines are in a same layer and extend along a same direction, and the one first signal line and the two second signal lines are in different layers and are insulated from each other; and a center line of an orthographic projection of the one second signal line on the base substrate along an extending direction of the one second signal line overlaps with a center line of an orthographic projection of an interval region between the two first signal lines along an extending direction of the two first signal lines.

Optionally, in each of the at least one signal line unit, the orthographic projection of the one second signal line on the base substrate at least partially overlaps with the orthographic projections of the two first signal lines on the base substrate, respectively; and an overlapping area between the orthographic projection of the one second signal line on the base substrate and the orthographic projections of one of the two first signal lines on the base substrate is the same as an overlapping area between the orthographic projection of the one second signal line on the base substrate and the orthographic projections of the other of the two first signal lines on the base substrate.

Optionally, in each of the at least one signal line unit, the two first signal lines and the one second signal line each are a broken line; and an overlapping width between the orthographic projection of the one second signal line on the base substrate and the orthographic projection of one of the two first signal lines on the base substrate is the same as an overlapping width between the orthographic projection of the one second signal line on the base substrate and the orthographic projection of the other of the two first signal lines on the base substrate.

Optionally, the at least one signal line unit includes a plurality of signal line units; and in the fan-out region, in a direction from each of two edges of the fan-out region to a center of the fan-out region, the plurality of signal line units are sequentially arranged in the direction, and second signal lines of the plurality of signal line units are gradually reduced in line length along an extending direction thereof and are gradually reduced in line width.

Optionally, the second signal lines of the plurality of signal line units in the fan-out region have a same line width.

Optionally, in the plurality of signal line units, the first signal lines have a same line width, and the second signal lines each have a line width greater than the line width of one of the first signal lines and less than a total line width of two of the first signal lines.

Optionally, the second signal line has a line width in a range from 4.8 µm to 5.0 µm.

Optionally, orthographic projections of the plurality of signal line units on the base substrate do not overlap with each other; and at least some of the first signal lines and the second signal lines in different signal line units of the plurality of signal line units extend along a same direction.

Optionally, the array substrate further includes a display region, wherein the fan-out region is adjacent to the display region and is at a side of the display region, and at least one pixel unit and at least one touch electrode are provided in the display region; and the first signal line extends to the display region to be coupled to a corresponding pixel unit and serves as a data line of the corresponding pixel unit, and the second signal line extends to the display region to be coupled to a corresponding touch control electrode and serves as a touch control signal line of the corresponding touch control electrode.

Optionally, the array substrate further includes an insulating layer between a layer where the second signal lines are located and a layer where the first signal lines are located along a direction perpendicular to the base substrate.

Optionally, the insulating layer includes a first sub-layer and a second sub-layer, and the second sub-layer is on a side of the first sub-layer distal to the base substrate, and the first sub-layer has a thickness in a range from 2000 nm to 2500 nm along a direction perpendicular to the base substrate, and the second sub-layer has a thickness in a range from 80 nm to 150 nm along the direction perpendicular to the base substrate.

Optionally, the first sub-layer has a thickness of 2300 nm, and the second sub-layer has a thickness of 100 nm.

Optionally, the first sub-layer has a dielectric constant in a range from 3 to 3.5, and the second sub-layer has a dielectric constant in a range from 6 to 7.5.

Optionally, the first sub-layer has a dielectric constant of 3.25, and the second sub-layer has a dielectric constant of 7.

Optionally, a material of the first sub-layer includes an organic resin material, and a material of the second sub-layer includes an inorganic insulating material.

Optionally, the material of the first sub-layer includes an acrylic material, and the material of the second sub-layer includes one of silicon nitride or silicon oxynitride.

Optionally, in each of the at least one signal line unit, voltage signals of opposite polarities are supplied to the two first signal lines.

According to another aspect of the present disclosure, a display panel is further provided. The display panel includes the above array substrate and one or more integrated circuits for driving the array substrate.

Optionally, the one or more integrated circuits are coupled to corresponding pixel units and corresponding touch electrodes in the display region in the array substrate through the at least one signal line unit.

Optionally, in each of the at least one signal line unit, an orthographic projection of the one second signal line on the base substrate at least partially overlaps with orthographic projections of the two first signal lines on the base substrate, respectively; and an overlapping area between the orthographic projection of the second signal line on the base substrate and the orthographic projections of one of the two first signal lines on the base substrate is the same as an overlapping area between the orthographic projection of the one second signal line on the base substrate and the orthographic projections of the other of the two first signal lines on the base substrate.

DETAILED DESCRIPTION

In order to make those skilled in the art better understand the technical solution of the present disclosure, an array substrate and a display panel in the present disclosure are described in detail below with reference to the accompanying drawings.

At present, the touch function of a conventional vehicle-mounted display product is realized by an out-cell touch screen, which has a high cost and poor touch function. Therefore, a vehicle-mounted TDDI (Touch and Display Driver Integration, i.e., a vehicle-mounted display product with an embedded touch screen) design becomes the current main solution. However, capacitive coupling between signal lines in a fan-out region (i.e., a fan-shaped wiring region of a display panel) of a vehicle-mounted TDDI product may cause severe flicker in a display picture. Moreover, a difference in touch signal intensity caused by the capacitive coupling between the signal lines can cause that the touch electrode block can be relatively obviously observed by human eyes in a display picture, and the display and touch performance of the vehicle-mounted TDDI product can be seriously influenced.

Figure 1:
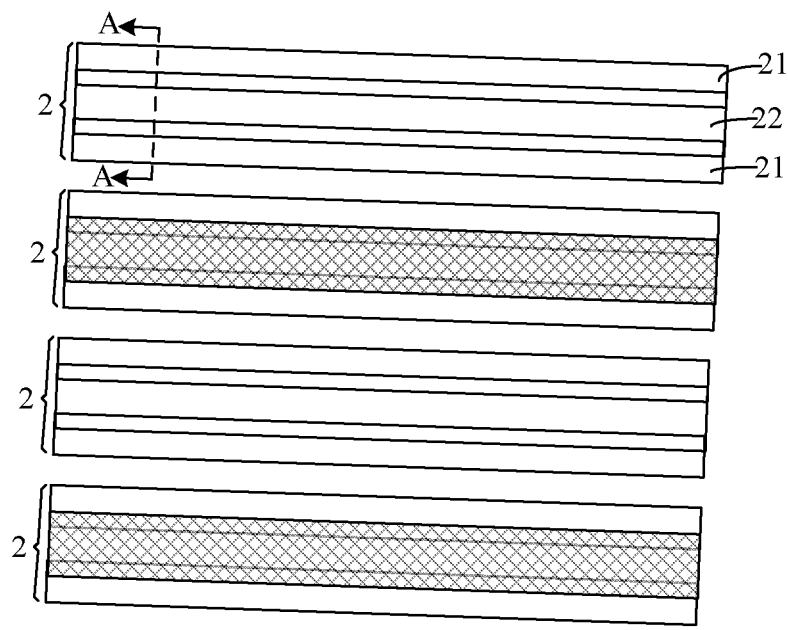
FIG. 1 is a schematic top view of a wiring in a fan-out region of an array substrate according to an embodiment of the present disclosure.
Figure 2A:
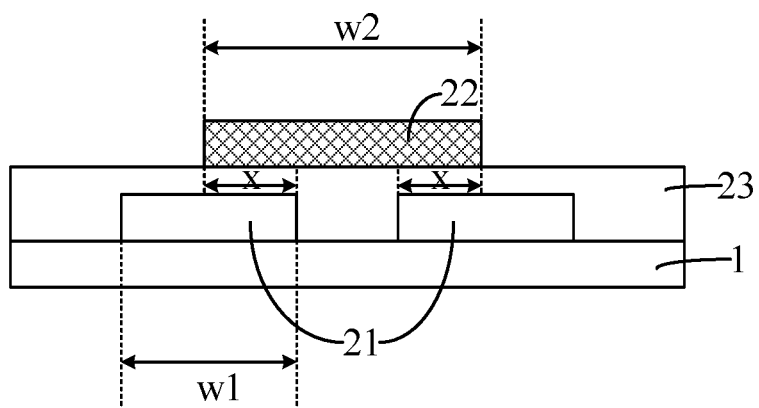
FIG. 2a is a cross-sectional view of a signal line unit taken along a line AA in a fan-out region of FIG. 1.

Therefore, an embodiment of the present disclosure provides an array substrate. FIG. 1 is a schematic top view of a wiring in a fan-out region of an array substrate according to an embodiment of the present disclosure. FIG. 2a is a cross-sectional view of a signal line unit along a line AA in a fan-out region of FIG. 1. As shown in FIGS. 1 and 2a, the array substrate includes a base substrate 1 and at least one signal line unit 2 on the base substrate 1. The array substrate further includes a fan-out region, and the at least one signal line unit 2 is in the fan-out region 101. Each of the at least one signal line unit 2 includes two first signal lines 21 and one second signal line 22. In each of the at least one signal line unit 2, the two first signal lines 21 are located in a same layer and extend along a same direction, and the one first signal line 21 and the two second signal lines 22 are respectively located in different layers and extend along a same direction.

As shown in FIG. 2a, generally, an insulating layer 23 is provided between the first signal line 21 and the second signal lines 22 and the two second signal lines 22 are spaced apart from each other through the insulating layer 23, i.e., the three lines are insulated from each other and extend in a same direction. In each of the at least one signal line unit 2 of the present disclosure, a center line, along an extending direction of the second signal line 22, of an orthogonal projection of the second signal line 22 on the base substrate 1 overlaps with a center line, along an extending direction of the two first signal lines 21, of an orthogonal projection of a spaced region between the two first signal lines 21 on the base substrate 1.

The array substrate of the present disclosure further includes a display region, the fan-out region is located on a side of the display region, and the fan-out region is adjacent to the display region 102. At least one pixel unit is provided in the display region 102. The at least one pixel unit may include a plurality of pixel units arranged in an array. Each of the plurality of pixel units includes a switch transistor, a pixel electrode, and a common electrode. The switch transistor includes a gate electrode, an active layer, a first electrode and a second electrode. The common electrode is also used as a touch electrode, and the common electrode may be divided into at least one touch electrode or even a plurality of touch electrodes spaced apart from each other. A first signal line 21 further extends to the display region and is coupled as a data line to a corresponding pixel unit, specifically to the first electrode of the switch transistor in the corresponding pixel unit. The second electrode of the switch transistor is coupled to the pixel electrode. A data signal is provided to the pixel electrode through the first signal line 21. The second signal line 22 extends to the display region and is coupled as a touch signal line to the common electrode. A touch driving signal is provided to the common electrode through the second signal line 22 during a touch phase. That is, in the present embodiment, the first signal lines 21 may be used as a data line, and the second signal line 22 may be used as a touch signal line. The pixel electrode and the common electrode are used for forming an electric field therebetween for driving liquid crystal molecules to deflect during a display phase, and the common electrode is also used as a touch electrode during a touch phase, so that the array substrate is an array substrate with an embedded touch function.

In the present embodiment, the display region is used for normal display and touch control. The fan-out region is a wiring region of the array substrate, and first signal lines 21 and second signal lines 22 are distributed in the fan-out region.

Figure 5:
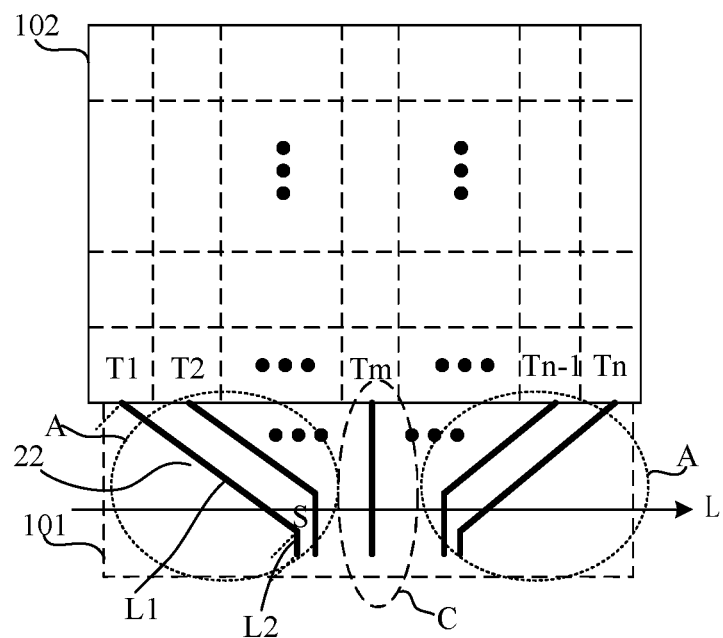
FIG. 5 is a schematic top view illustrating a distribution of second signal lines in a fan-out region and an arrangement of touch electrode blocks in a display region of an array substrate according to an embodiment of the present disclosure.

Optionally, the at least one signal line unit includes a plurality of signal line units, orthographic projections of the plurality of signal line units on the base substrate 1 do not overlap with each other, and at least some of the first signal lines and the second signal lines in different ones of the plurality of signal line units extend along a same direction. As shown in FIG. 5, the lines in different signal line units in an outer sub-region A (e.g., the second signal lines) extend along a same direction. Specifically, the second signal line 22 may be a broken line (i.e., a straight line after being bent, or a polygonal line, or a bent line, or a fold line), which includes at least a first segment L1 and a second segment L2 connected to the first segment L1. The first segment and the second segment are connected to each other at an inflection point S. The first segment L1 and the second segment L2 extend along different directions (that is, they have an included angle), and intersect and connect to each other at the inflection point S. The extension direction of the first segment L1 of the plurality of second signal lines 22 may be identical, and the extension direction of the second segment L2 of the plurality of second signal lines 22 may also be identical, but the first segment L1 and the second segment L2 may have different extension lengths, as shown in FIG. 5. Moreover, some of the second signal lines 22 may be straight lines, as shown in an inner sub-region C in FIG. 5.

Further, as shown in FIG. 5, since the plurality of second signal lines 22 converge in the fan-out region 101 and are then coupled to a driving IC, the plurality of second signal lines 22 gradually converge in a direction approaching the driving IC (i.e., a distribution density of the second signal lines 22 increases). Correspondingly, a plurality of first signal lines 21 also gradually converge in the direction approaching the driving IC and are then coupled to the driving IC. In addition, the plurality of second signal lines 22 and the plurality of first signal lines 21 are symmetrically arranged along a direction from two sides of the fan-out region 101 to a center (i.e., along a first direction L), and different second signal lines 22 and different first signal lines 21 have different distance and relative position with respect to the driving IC, so that the arrangement of the plurality of second signal lines 22 and the arrangement of the plurality of first signal lines 21 in the display region 102 is different from those in the fan-out region 101. For example, the plurality of second signal lines 22 and the plurality of first signal lines 21 also extend to the display region 102. In the display region 102, the plurality of second signal lines 22 and the plurality of first signal lines 21 may be parallel to each other. The arrangement of the first signal lines and the second signal lines in parallel to each other in the display region 102 is different from the arrangement of the first signal lines and the second signal lines in the fan-out region 101 that gradually converges at the driving IC. Alternatively, all of the second signal lines 22 may be straight lines.

In the embodiment, by adopting the wiring in the signal line units 2 in the fan-out region of the array substrate, compared with irregular arrangement of the second signal lines in a layer where the second signal lines 22 are located in the related art, the orthographic projection of the second signal line 22 may be located between the orthographic projections of the two first signal lines 21 and may be regularly arranged in each of the signal line units. The flicker in a picture due to the capacitive coupling between the first signal lines 21 and the second signal lines 22 in the fan-out region can be reduced or even eliminated by adopting the wiring in the fan-out region, and the signal energy difference due to the capacitive coupling between the first signal lines 21 and the second signal lines 22 can be effectively reduced, thereby reducing or even eliminating the issue that the touch electrode block can be observed by human eyes due to the signal intensity difference on the second signal lines 22, and enhancing the display and touch performance of the array substrate. In addition, by providing the first signal lines 21 and the second signal lines 22 in different layers, the occupied area of the first signal lines 21 and the second signal lines 22 can be reduced, thereby realizing a narrow bezel of the array substrate.

Optionally, in each of the at least one signal line unit 2, the orthographic projection of the second signal line 22 on the base substrate 1 at least partially overlaps with the orthographic projections of the two first signal lines 21 on the base substrate 1, respectively. The overlapping areas of the orthographic projection of the second signal line 22 on the base substrate 1 respectively with the orthographic projections of the two first signal lines 21 on the base substrate 1 are identical. That is, an overlapping (a first) area between the orthographic projection of the one second signal line on the base substrate and the orthographic projections of one of the two first signal lines on the base substrate is the same as an overlapping (a second) area between the orthographic projection of the one second signal line on the base substrate and the orthographic projections of the other of the two first signal lines on the base substrate.

Optionally, as shown in FIGS. 1 and 2a, in each of the at least one signal line unit, the two first signal lines and the one second signal line each may be a straight line (or a broken line, or a segment-line), and overlapping widths of the orthographic projection of the one second signal line on the base substrate 1 respectively with the orthographic projections of the two first signal lines on the base substrate 1 are identical. Specifically, an overlapping (a first) width between the orthographic projection of the one second signal line on the base substrate and the orthographic projection of one of the two first signal lines on the base substrate is the same as an overlapping (a second) width between the orthographic projection of the one second signal line on the base substrate and the orthographic projection of the other of the two first signal lines on the base substrate. That is, as shown in FIG. 2a, the overlapping widths of the orthographic projection of the second signal line on the base substrate 1 respectively with the orthographic projections of the two first signal lines on the base substrate 1 each are X. In the present disclosure, the first signal lines and the second signal lines of a straight line are taken as an example, but the present disclosure is not limited thereto.

Further optionally, in each of the at least one signal line unit, voltage signals of opposite polarities are supplied to the two first signal lines, that is, polarities of data signals input to the pixel electrodes in the pixel units of two adjacent columns are opposite to each other. The two first signal lines 21 in one signal line unit 2 are respectively used for inputting data signals therethrough to the pixel electrodes in the pixel units of the two adjacent columns, that is, the polarities of the data signals input to the pixel electrodes through the two first signal lines 21 in one signal line unit 2 are opposite to each other. In the embodiment, a column inversion driving mode may be adopted when the pixel unit array in the display region performs display, so that the polarities of the data signals input to the pixel electrodes in the pixel units of the two adjacent columns are opposite to each other.

In one embodiment, during charging the pixel electrode, for example, in one signal line unit 2, a data signal voltage on one of the two first signal lines 21 is gradually changed from 0V to 5V, and a data signal voltage of the other of the two first signal lines 21 is gradually changed from 0V to −5V. In this case, capacitive coupling between the second signal line 22 and the two first signal lines 21 in the signal line unit 2 may occur.

Figure 3:
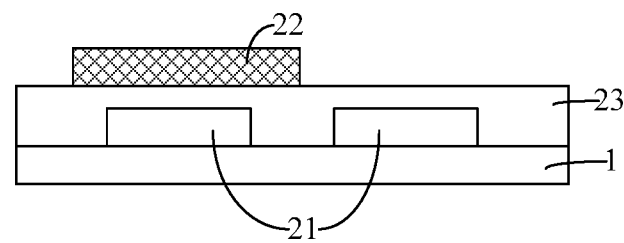
FIG. 3 is a cross-sectional view of a signal line unit in a fan-out region taken along a line perpendicular to an extending direction of the signal line unit in the related art.

FIG. 3 is a schematic cross-sectional view of a signal line unit in a fan-out region along a line perpendicular to an extending direction of the signal line unit in the related art. As shown in FIG. 3, the second signal line 22 overlaps with only one of the two first signal lines 21, and the voltage of a touch driving signal transmitted on the second signal line 22 is raised by 150 mv due to the capacitive coupling, which makes the touch electrode block driven by the second signal line 22 obviously visible, so that the touch electrode block can be obviously observed in the display screen using the array substrate.

Figure 4:
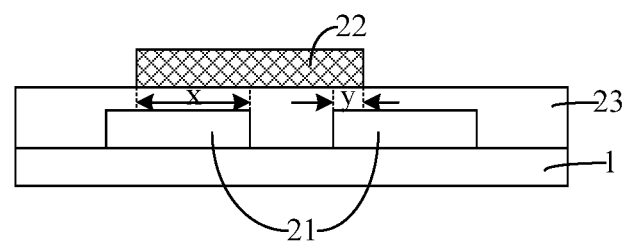
FIG. 4 is a cross-sectional view of a signal line unit in a fan-out region taken along a line perpendicular to an extending direction of the signal line unit in the related art.

FIG. 4 is a schematic cross-sectional view of a signal line unit in a fan-out region along a line perpendicular to an extending direction of the signal line unit in the related art. As shown in FIG. 4, the second signal line 22 overlaps with both the two first signal lines 21, but the overlapping width x (or overlapping area) of the second signal line 22 with one of the two first signal lines 21 is larger than the overlapping width y (or overlapping area) with the other of the two first signal lines 21. In this case, since the second signal line 22 is subjected to the capacitive coupling of one of the two first signal lines 21 having a larger overlapping area, the voltage of the touch driving signal thereon is raised by 110 mv; and since the second signal line 22 is subjected to the capacitive coupling of the other of the two first signal lines 21 having a smaller overlapping area, the voltage of the touch driving signal thereon is raised by 30 mv. Therefore, the voltage of the touch driving signal on the second signal line 22 is finally raised by about 80 mv. In this case, the touch electrode block driven through the second signal line 22 can still be weakly observed, so that the touch electrode block can still be weakly observed in the display screen using the array substrate.

By adopting the wiring of the signal line unit 2 in the present embodiment as shown in FIG. 2a, the second signal line 22 overlaps with both of the two first signal lines 21, and the overlapping widths x and the overlapping areas of the orthographic projection of the second signal line 22 respectively with the orthographic projections of the two first signal lines 21 are identical. When the polarities of the data signals on the two first signal lines 21 are opposite to each other, the capacitive couplings generated on the second signal line 22 by the two first signal lines 21 having different signal polarities may be balanced out. Thus, the capacitive coupling on the second signal line 22 in the signal line unit 2 in the fan-out region can be balanced out, and further, the touch electrode block driven through the second signal line 22 can no longer be observed, so that the touch electrode block cannot be visible in the display screen adopting the array substrate.

In the present embodiment, in each of the plurality of signal line units 2, line widths (i.e., w1) of the orthographic projections of the two first signal lines 21 on the base substrate 1 are identical, and a line width (i.e., w2) of the orthographic projection of the second signal line 22 is larger than the line width of one of the two first signal lines 21 and smaller than a sum of the line width of the two first signal lines 21. By the above configuration, the orthographic projection of the second signal line 22 on the base substrate 1 is between the orthographic projections of the two first signal lines 21 on the base substrate 1, and the second signal line 22 and the two first signal lines 21 are regularly arranged, so that the flicker in a picture due to the capacitive coupling between the first signal line 21 and the second signal lines 22 in the fan-out region can be reduced or even eliminated, the signal intensity difference due to capacitive coupling between the first signal lines 21 and the second signal lines 22 can be effectively reduced, and the issue that the touch electrode block can be observed due to the signal intensity difference on the second signal lines 22 is reduced or even eliminated.

In the embodiment, the line widths of the second signal lines 22 in the signal line units 2 in the fan-out region may be identical. The second signal line 22 may have a line width w2 in a range from 4.8 μm to 5.0 μm, and specifically the line width w2 may be 4.8 μm, 4.9 μm, 5.0 μm, and the like.

In the related art, the second signal line 22 has a line width range from 4.2 μm to 4.5 μm. FIG. 5 is a schematic top view illustrating a distribution of second signal lines in a fan-out region and an arrangement of touch electrode blocks in a display region of an array substrate according to an embodiment of the present disclosure. As shown in FIG. 5, in a large size array substrate, there is an inherent loading difference between the second signal lines 22 in the fan-out region 101 due to different line lengths. For example, in FIG. 5, an inner line is shown in an inner sub-region C close to a center line (perpendicular to a first direction L in FIG. 5) of the fan-out region 101, and an outer line is shown in an outer sub-region A (along the first direction L in FIG. 5) close to an edge of the fan-out region 101. The outer line is longer than the inner line. Compared to the inner line, the outer line has a larger resistance and results in a larger loss of the signal intensity on the second signal line 22, so that the touch electrode block (e.g., T1, T2) driven through the outer line has a lower signal intensity than the touch electrode block (e.g., Tm) driven through the inner line. The measured data shows that the signal intensity on the touch electrode block driven through the outer line can only reach 60% of the signal intensity on the touch electrode block driven through the inner line. Since the compensation on the signal intensity of a touch driving chip (i.e., a touch driving IC) is limited, consistency between the signal intensity on the touch electrode block driven through the outer line and the signal intensity on the touch electrode block driven through the inner line cannot be realized, which may cause visible and obvious vertical strip-shaped touch electrode blocks in the display region 102 of the display screen adopting the array substrate and seriously affect normal display. In the present disclosure, the line width of the second signal line in the signal line unit 2 in the fan-out region is set within a predetermined range, so that the difference in the touch signal intensity due to the different line loads of the inner second signal line 22 and the outer second signal line 22 in the fan-out region 101 can be effectively reduced. Meanwhile, since a resistance of a signal line (i.e., a line load) is inversely proportional to its line width, the resistance of the line is reduced as a line width of the line is increased, so that the reduction of the difference in the touch signal intensity between the inner line and the outer line can be realized by increasing the line width of the second signal line 22. For example, in the embodiment, by increasing the line width of the second signal line 22 in a range from 4.2 μm to 4.5 μm to a range from 4.8 μm to 5.0 μm, and by combining with the wiring in the signal line unit 2 in the fan-out region 101 in the embodiment, the signal intensity on the touch electrode block driven through the outer line may reach 80% of the signal intensity on the touch electrode block driven through the inner line. In addition, by combining with further signal intensity compensation of a touch driving chip (i.e., a touch driving IC), the signal intensity on the touch electrode block driven through the outer line can be ensured to be consistent with the signal intensity on the touch electrode block driven through the inner line, so that a normal touch and a display of the display screen adopting the array substrate are realized.

Optionally, the array substrate further includes an insulating layer 23. The insulating layer 23 is located between a layer where the second signal lines are located and a layer where the first signal lines are located in a direction perpendicular to the base substrate 1, and is used for insulating the first signal lines and the second signal lines from each other.

Figure 2B:
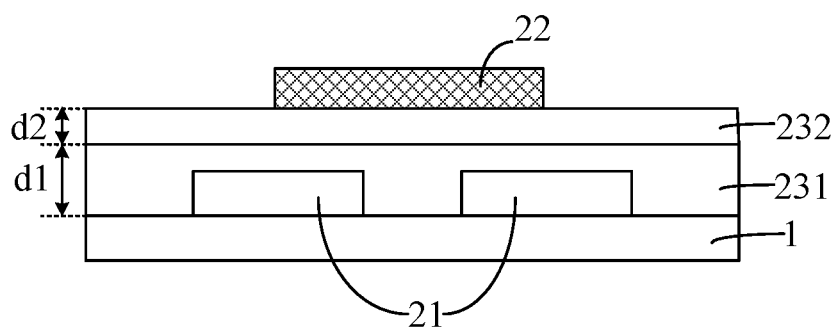
FIG. 2b is a cross-sectional view of a signal line unit taken along a line AA in a fan-out region of FIG. 1.

Optionally, as shown in FIG. 2b, the insulating layer 23 includes a first sub-layer 231 and a second sub-layer 232. The first sub-layer 231 and the second sub-layer 232 are stacked on each other, and the second sub-layer 232 is located on a side of the first sub-layer 231 distal to the base substrate 1. The first sub-layer has a thickness d1 in a range from 20000 Å to 25000 Å (i.e., 2000 nm to 2500 nm), and the second sub-layer 232 has a thickness d2 in a range from 800 Å to 1500 Å (i.e., 80 nm to 150 nm). In this case, the total thickness of the insulating layer 23 can be increased. In a specific example, the first sub-layer 231 has a thickness of 2300 nm, and the second sub-layer 232 has a thickness of 100 nm.

Optionally, the first sub-layer 231 may have a dielectric constant in a range from 3 to 3.5, such as 3.05, 3.10, 3.15, 3.20, 3.25, 3.30, 3.35, 3.40, 3.45, or 3.50. The second sub-layer 232 may have a dielectric constant in the range from 6 to 7.5, such as 6, 6.1, 6.2, 6.3, 6.4, 6.5, 6.6, 6.7, 6.8, 6.9, 7.0, 7.1, 7.2, 7.3, 7.4, or 7.5. In one specific example, the dielectric constant of the first sub-layer 231 is 3.25, and the dielectric constant of the second sub-layer 232 is 7.

Optionally, a material of the first sub-layer 231 may include an organic resin material, such as an acryl resin material; and a material of the second sub-layer 232 may include an inorganic insulating material, such as silicon nitride, or silicon oxynitride.

The capacitive coupling effect between the signal lines results from influence of the voltage difference between the signal lines on the signals on the signal lines, and the strength of the capacitive coupling effect is directly related to the overlapping area between the signal lines and the property of the medium between the signal lines. In the embodiment, the insulating layer 23 between the first and second signal lines 21 and 22 may be composed of a first sub-layer of an acrylic resin material having a thickness of 23000 Å and a dielectric constant of 3.25, and a second sub-layer of a silicon nitride material having a thickness of 1000 Å and a dielectric constant of 7. Since the strength of the capacitive coupling between the signal lines decreases with the increase of the thickness of the insulating layer 23 between the signal lines and decreases with the decrease of the dielectric constant of the material of the insulating layer 23, the thickness of the insulating layer 23 between the first signal lines 21 and the second signal lines 22 can be increased and the dielectric constant of the insulating layer 23 is relatively small by adopting the above insulating layer 23 in the embodiment, so that the influence of the capacitive coupling effect on the touch signal on the second signal line 22 can be effectively reduced.

Figure 6A:
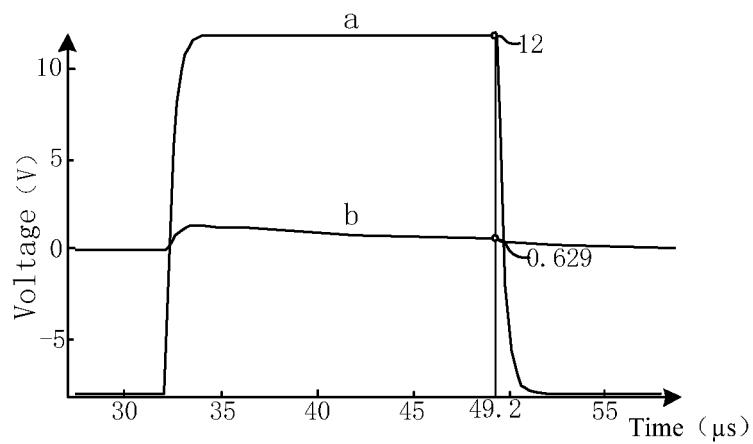
FIG. 6a illustrates a simulation result of a touch signal coupling value on a second signal line when a signal line unit in the fan-out region shown in FIG. 3 is adopted.
Figure 6B:
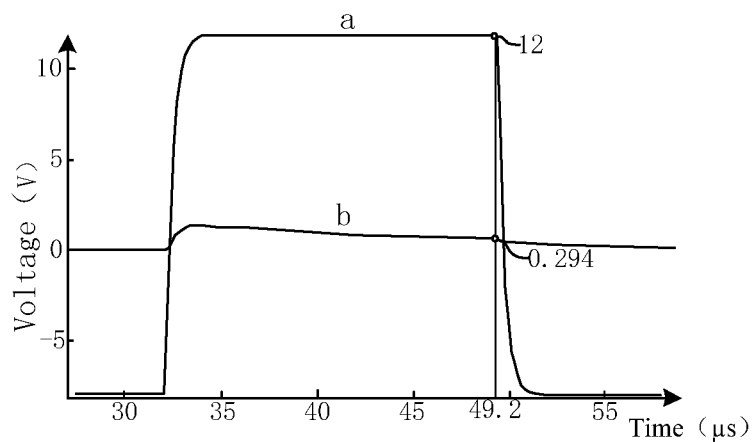
FIG. 6b illustrates a simulation result of a touch signal coupling value on a second signal line when a signal line unit in the fan-out region shown in FIG. 4 is adopted.
Figure 6C:
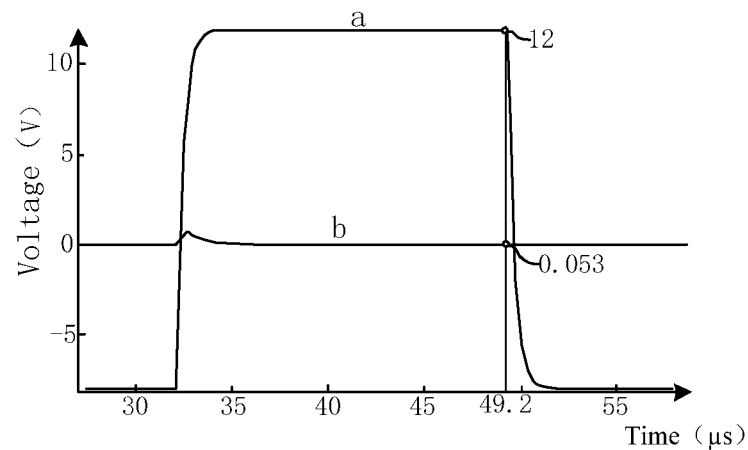
FIG. 6c illustrates a simulation result of a touch signal coupling value on a second signal line when a signal line unit in the fan-out region shown in FIG. 2 is adopted.

Based on the related art and the above array substrate of the present disclosure, FIG. 6a illustrates a simulation result of a touch signal coupling value on a second signal line when a signal line unit in the fan-out region shown in FIG. 3 is adopted. FIG. 6b illustrates a simulation result of a touch signal coupling value on a second signal line when a signal line unit in the fan-out region shown in FIG. 4 is adopted. FIG. 6c illustrates a simulation result of a touch signal coupling value on a second signal line when a signal line unit in the fan-out region shown in FIG. 2 is adopted. As shown in FIGS. 6a to 6c, simulation results of the touch signal coupling value on the second signal line 22 in the fan-out region under different wiring modes are shown, wherein a curve a represents a gate signal (Gate) of the switch transistor, and a curve b represents a common voltage signal (Vcom) on the common electrode. As shown in FIGS. 6a to 6c, when the gate signal starts to be decreased, i.e., the switch transistor is turned off and the pixel electrode is not charged, the common voltage signal (Vcom) on the common electrode at this time is defined as the touch signal coupling value on the second signal line 22. As can be seen from the simulation result, when the gate signal is decreased, the touch signal coupling value on the second signal line 22 is 0.629V (as shown in FIG. 6a) corresponding to the wiring in the signal line unit 2 in FIG. 3; the touch signal coupling value on the second signal line 22 is 0.294V (as shown in FIG. 6b) corresponding to the wiring in the signal line unit 2 in FIG. 4; and the touch signal coupling value on the second signal line 22 is 0.053V (as shown in FIG. 6 c) corresponding to the wiring in the signal line unit 2 in the embodiment shown in FIG. 2. As can be seen from comparison between FIG. 6a to FIG. 6c, the wiring in the signal line unit 2 in the fan-out region in the embodiment can effectively reduce the capacitive coupling on the touch electrode block in the display region.

Figure 7:
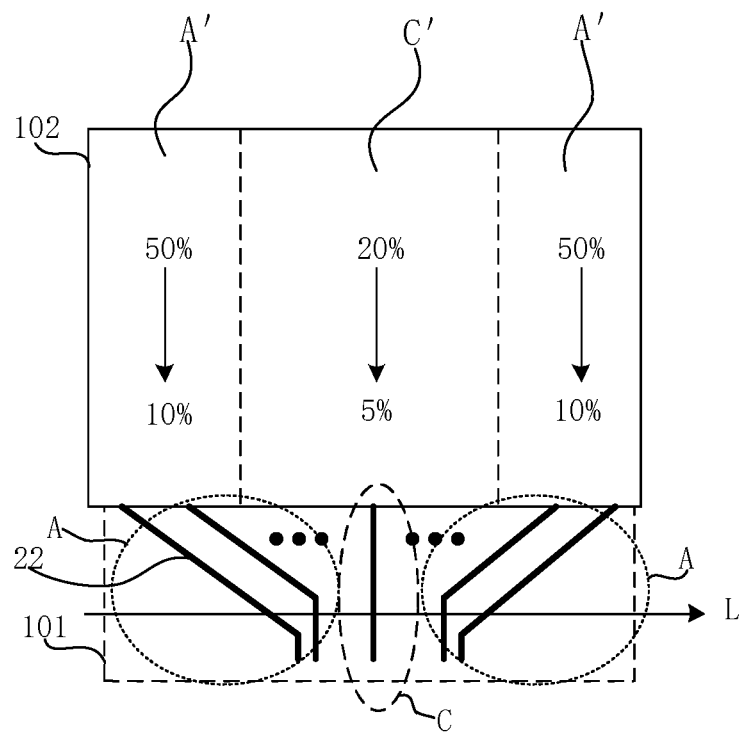
FIG. 7 illustrates a change of flicker in a picture in different sub-regions of a display region before and after a wiring in a fan-out region according to an embodiment of the present disclosure is adopted.

FIG. 7 illustrates a change of flicker in a picture in different sub-regions of a display region before and after a wiring in a fan-out region according to an embodiment of the present disclosure is adopted. As shown in FIG. 7, the difference in intensities of the touch signals on the second signal lines 22 respectively in an inner sub-region C close to a center line (perpendicular to a first direction L in FIG. 7) of the fan-out region 101 and in an outer sub-region A close to an edge (along the first direction L in FIG. 8) of the fan-out region 101, is caused by the difference in the resistance of second signal lines 22 respectively in the inner sub-region C of the fan-out region 101 and in the outer sub-region A of the fan-out region 101, and a large difference in the touch signal intensity causes a large difference in the coupling capacitance of the second signal lines 22 respectively in the inner sub-region C and in the outer sub-region A. In addition, in the fan-out region 101, the overlapping area between the second signal line 22 and the first signal lines 21 in the inner sub-region C of the fan-out region 101 is not equal to the overlapping area between the second signal line 22 and the first signal lines 21 in the outer sub-region A of the fan-out region 101, resulting in the fact that the coupling capacitance between the second signal line 22 and the first signal lines 21 in the inner sub-region C of the fan-out region 101 is different from the coupling capacitance between the second signal line 22 and the first signal lines 21 in the outer sub-region A of the fan-out region 101. The difference in the coupling capacitance between the second signal lines 22 and the first signal lines 21 respectively in the inner sub-region and in the outer sub-region of the fan-out region 101 may cause the difference in the severity of the flicker of the display screen respectively in the inner sub-region and in the outer sub-region of the fan-out region 101. For example, the severity of the flicker in a picture in an inner sub-region C' (provided with a driving signal through the signal line unit 2 in the inner sub-region C of the fan-out region 101) of the display region 102 is smaller, and the severity of the flicker in a picture in an outer sub-region A' (provided with a driving signal through the signal line unit 2 in the outer sub-region A of the fan-out region 101) of the display region 102 is larger. By adopting the wiring of the signal line unit 2 in the fan-out region 101 in the embodiment, the severity of the flicker in a display picture in the display region 102 can be effectively reduced, and the display quality can be enhanced. By adopting the wiring of the signal line unit 2 in the fan-out region in the embodiment, the severity of the flicker in a display picture in the outer sub-region A' of the display region 102 (provided with a driving signal through the signal line unit 2 in the outer sub-region A of the fan-out region 101) is reduced from 50% before adopting the improved wiring to less than 10%, and the severity of the flicker of a display picture in the inner sub-region C'(provided with a driving signal through the signal line unit 2 in the inner sub-region C of the fan-out region 101) is reduced from 20% before adopting the improved wiring to 5%, so that the display and touch performance of the array substrate can be effectively enhanced.

Figure 8:
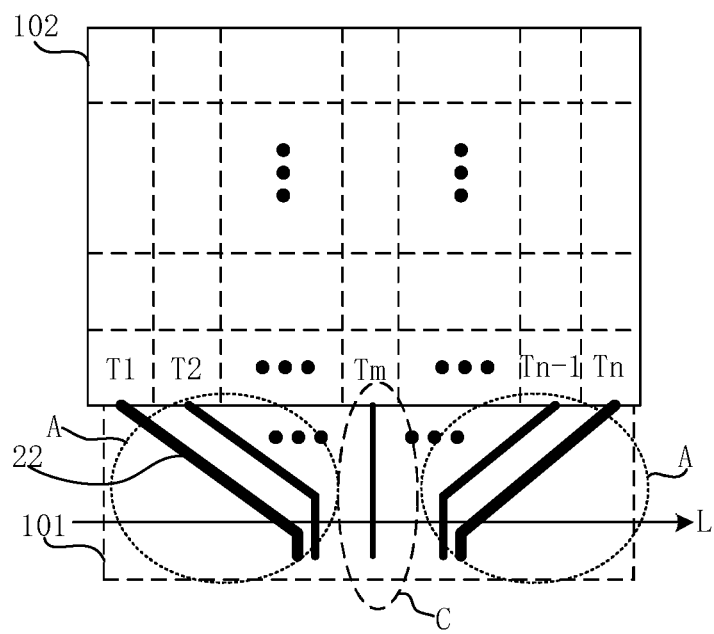
FIG. 8 is a schematic top view illustrating a distribution of second signal lines in a fan-out region and an arrangement of touch electrode blocks in a display region of an array substrate according to an embodiment of the present disclosure.

An embodiment of the present disclosure further provides an array substrate. FIG. 8 is a schematic top view illustrating a wiring of a second signal line in a fan-out region and an arrangement of a touch electrode block in a display region of an array substrate according to an embodiment of the present disclosure. As shown in FIG. 8, unlike the above embodiments, in the fan-out region 101, a plurality of signal line units are arranged in order in the first direction L. In a direction from both edges at two sides of the fan-out region 101 toward the center of the fan-out region 101, the second signal lines 22 in the signal line units are gradually reduced in line length along an extending direction thereof and are gradually reduced in line width.

Other structures and configurations of the array substrate in the embodiment are the same as those in the above embodiments, and are not described herein again.

In the embodiment, the region close to the edges at the two sides of the fan-out region 101 are the outer sub-region of the fan-out region 101, and a center region of the fan-out region 101 is the inner sub-region of the fan-out region 101. The second signal line 22 in the outer sub-region of the fan-out region 101 is longer, has a larger line resistance, and thus has a larger line load; and the second signal line 22 in the inner sub-region is shorter, has a smaller line resistance, and thus has a smaller line load. By gradually reducing the line width of the second signal lines 22 along a direction from the outer sub-region to the inner sub-region of the fan-out region 101, the resistance of the second signal lines 22 in the outer sub-region of the fan-out region 101 can be reduced, so that the resistances of the second signal line 22 in the outer sub-region tend to be consistent with the resistances of the second signal line 22 in the inner sub-region of the fan-out region 101, further the loss of the signal intensity on the second signal line 22 in the outer sub-region tends to be consistent with the loss of the signal intensity on the second signal line 22 in the inner sun-region of the fan-out region 101, and finally the signal intensity on the touch electrode block (e.g., T1 and T2) driven through the second signal line 22 in the outer sub-region of the fan-out region 101 tends to be consistent with the signal intensity on the touch electrode block (e.g., Tm) driven by the second signal line 22 in the inner sub-region of the fan-out region 101. The second signal lines 22 of different line widths combining with the wiring in the signal line unit in the fan-out region 101, the phenomenon that vertical strip-shaped touch electrodes in the display region of the display screen of the array substrate are observed can be reduced or even eliminated, and the touch and display performance of the display screen can be enhanced.

In the array substrate in the above embodiments, by adopting the above wiring in the signal line unit in the fan-out region, the orthographic projection of the second signal line may be located between the orthographic projections of the two first signal lines and are regularly arranged, so that the flicker in a picture due to the capacitive coupling between the first signal line and the two second signal lines in the fan-out region can be reduced or even eliminated, meanwhile the signal intensity difference due to the capacitive coupling between the first signal line and the second signal lines can be effectively reduced, thereby reducing or eliminating the issue that the touch electrode block is observed due to the signal intensity difference on the second signal lines, and enhancing the display and touch performance of the array substrate. In addition, the first signal lines and the second signal lines are respectively provided in different layers, so that the occupied areas of the first signal lines and of the second signal lines can be reduced, and the narrow bezel of the array substrate is realized.

Figure 9:
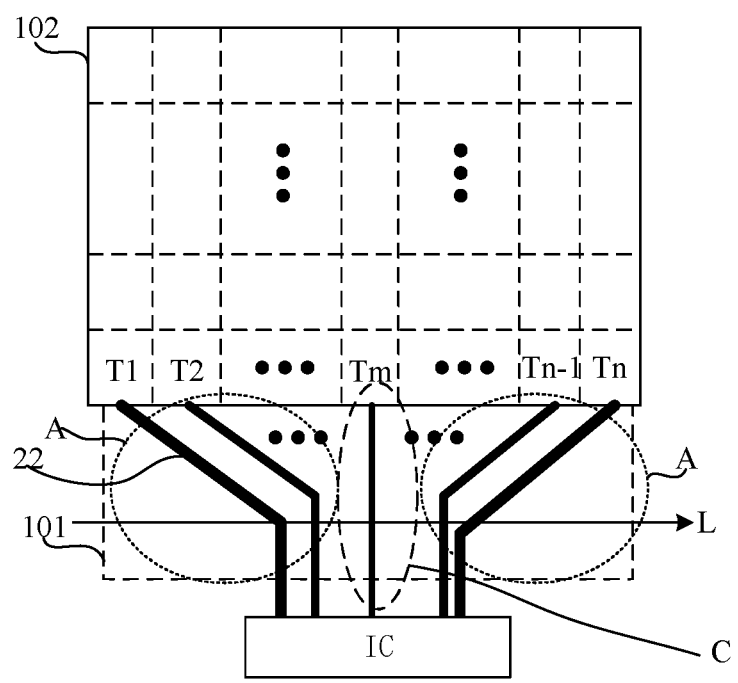
FIG. 9 is a schematic diagram of a display panel according to an embodiment of the disclosure.

An embodiment of the present disclosure further provides a display panel, and the display panel includes the array substrate in any of the above embodiments and one or more integrated circuits IC for driving the array substrate, as shown in FIG. 9. Moreover, the one or more integrated circuits IC are coupled to corresponding pixel units and corresponding touch electrodes in the display region 102 of the array substrate through at least one signal line unit.

By adopting the array substrate in any of the above embodiments, the flicker in a display picture of the display panel can be reduced or even eliminated, the issue that the touch electrode block of the display panel is visible can be reduced or eliminated, thereby enhancing the touch and display performance of the display screen and realizing the narrow bezel of the display panel.

The display panel provided by the embodiment may be any product or component with a display function, such as an LCD panel, an LCD television, a display, a mobile phone, a navigator and the like.

It should be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the disclosure, and these changes and modifications are to be considered within the scope of the disclosure.

What is claimed is:

1. An array substrate, comprising a base substrate and at least one signal line unit on the base substrate, the array substrate comprising a fan-out region, and the at least one signal line unit being in the fan-out region, wherein
each of the at least one signal line unit comprises two first signal lines and one second signal line;

in each of the at least one signal line unit, the two first signal lines are in a same layer and extend along a same direction, and the one second signal line and the two first signal lines are in different layers and are insulated from each other; and a center line of an orthographic projection of the one second signal line on the base substrate along an extending direction of the one second signal line overlaps with a center line of an orthographic projection of an interval region between the two first signal lines along an extending direction of the two first signal lines, wherein the at least one signal line unit comprises a plurality of signal line units, and in the fan-our region, in a direction from each of two edges of the fan-out region to a center of the fan-out region, the plurality of signal line units are sequentially arranged in the direction, and second signal lines of the plurality of signal line units are gradually reduced in line length along an extending direction thereof and are gradually reduced in line width.

2. The array substrate of claim 1, wherein in each of the at least one signal line unit, the orthographic projection of the one second signal line on the base substrate at least partially overlaps with the orthographic projections of the two first signal lines on the base substrate, respectively; and an overlapping area between the orthographic projection of the one second signal line on the base substrate and the orthographic projections of one of the two first signal lines on the base substrate is the same as an overlapping area between the orthographic projection of the one second signal line on the base substrate and the orthographic projections of the other of the two first signal lines on the base substrate.

3. The array substrate of claim 2, wherein in each of the at least one signal line unit, the two first signal lines and the one second signal line each are a broken line; and an overlapping width between the orthographic projection of the one second signal line on the base substrate and the orthographic projection of one of the two first signal lines on the base substrate is the same as an overlapping width between the orthographic projection of the one second signal line on the base substrate and the orthographic projection of the other of the two first signal lines on the base substrate.

4. The array substrate of claim 3, wherein the second signal lines of the plurality of signal line units in the fan-out region have a same line width.

5. The array substrate of claim 4, wherein the second signal lines each have a line width greater than the line width of one of the first signal lines and less than a total line width of two of the first signal lines.

6. The array substrate of claim 5, wherein the second signal line has a line width in a range from 4.8 μm to 5.0 μm.

7. The array substrate of claim 6, wherein orthographic projections of the plurality of signal line units on the base substrate do not overlap with each other; and at least some of the first signal lines and the second signal lines in different signal line units of the plurality of signal line units extend along a same direction.

8. The array substrate of claim 7, further comprising a display region, wherein the fan-out region is adjacent to the display region and is at a side of the display region, and at least one pixel unit and at least one touch electrode are provided in the display region; and the first signal line extends to the display region to be coupled to a corresponding pixel unit and serves as a data line of the corresponding pixel unit, and the second signal line extends to the display region to be coupled to a corresponding touch control electrode and serves as a touch control signal line of the corresponding touch control electrode.

9. The array substrate of claim 8, further comprising an insulating layer between a layer where the second signal lines are located and a layer where the first signal lines are located along a direction perpendicular to the base substrate.

10. The array substrate of claim 9, wherein the insulating layer comprises a first sub-layer and a second sub-layer, and the second sub-layer is on a side of the first sub-layer distal to the base substrate, and the first sub-layer has a thickness in a range from 2000 nm to 2500 nm along a direction perpendicular to the base substrate, and the second sub-layer has a thickness in a range from 80 nm to 150 nm along the direction perpendicular to the base substrate.

11. The array substrate of claim 10, wherein the first sub-layer has a thickness of 2300 nm, and the second sub-layer has a thickness of 100 nm.

12. The array substrate of claim 11, wherein the first sub-layer has a dielectric constant in a range from 3 to 3.5, and the second sub-layer has a dielectric constant in a range from 6 to 7.5.

13. The array substrate of claim 12, wherein the first sub-layer has a dielectric constant of 3.25, and the second sub-layer has a dielectric constant of 7.

14. The array substrate of claim 13, wherein a material of the first sub-layer comprises an organic resin material, and a material of the second sub-layer comprises an inorganic insulating material.

15. The array substrate of claim 14, wherein the material of the first sub-layer comprises an acrylic material, and the material of the second sub-layer comprises one of silicon nitride or silicon oxynitride.

16. The array substrate of claim 1, wherein in each of the at least one signal line unit, voltage signals of opposite polarities are supplied to the two first signal lines.

17. A display panel, comprising the array substrate of claim 1, and one or more integrated circuits for driving the array substrate.

18. The display panel of claim 17, wherein the one or more integrated circuits are coupled to corresponding pixel units and corresponding touch electrodes in the display region in the array substrate through the at least one signal line unit.

19. The display panel of claim 18, wherein in each of the at least one signal line unit, an orthographic projection of the one second signal line on the base substrate at least partially overlaps with orthographic projections of the two first signal lines on the base substrate, respectively; and an overlapping area between the orthographic projection of the second signal line on the base substrate and the orthographic projections of one of the two first signal lines on the base substrate is the same as an overlapping area between the orthographic projection of the one second signal line on the base substrate and the orthographic projections of the other of the two first signal lines on the base substrate.

* * * * *